(12) United States Patent
Jorzik

(10) Patent No.: US 11,702,732 B2
(45) Date of Patent: Jul. 18, 2023

(54) LINE-OF-SIGHT COATING FIXTURE AND APPARATUS

(71) Applicant: Raytheon Technologies Corporation, Farmington, CT (US)

(72) Inventor: Eric Jorzik, Annville, PA (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 17/668,591

(22) Filed: Feb. 10, 2022

(65) Prior Publication Data
US 2022/0162745 A1 May 26, 2022

Related U.S. Application Data

(62) Division of application No. 15/852,558, filed on Dec. 22, 2017, now abandoned.

(51) Int. Cl.
| C23C 14/04 | (2006.01) |
| B05C 21/00 | (2006.01) |
| C23C 14/50 | (2006.01) |
| B05C 13/02 | (2006.01) |
| C23C 14/56 | (2006.01) |
| H01J 37/20 | (2006.01) |
| C23C 14/24 | (2006.01) |
| F01D 5/00 | (2006.01) |
| C23C 10/04 | (2006.01) |

(Continued)

(52) U.S. Cl.
CPC ............ *C23C 14/505* (2013.01); *B05C 13/02* (2013.01); *B05C 21/005* (2013.01); *C23C 10/04* (2013.01); *C23C 14/042* (2013.01); *C23C 14/246* (2013.01); *C23C 14/56* (2013.01); *F01D 5/005* (2013.01); *H01J 37/20* (2013.01); *B05B 13/0228* (2013.01); *B05C 1/003* (2013.01); *B05C 15/00* (2013.01); *B05C 17/002* (2013.01); *F05D 2230/313* (2013.01); *H01J 37/32779* (2013.01); *H01J 2237/202* (2013.01)

(58) Field of Classification Search
CPC ............................ C23C 14/402; C23C 14/042
See application file for complete search history.

(56) References Cited

U.S. PATENT DOCUMENTS

| 4,108,107 A | 8/1978 | Scheuermann |
| 4,271,005 A | 6/1981 | Wright et al. |

(Continued)

OTHER PUBLICATIONS

Extended European Search Report for EP Application No. 18214948. 4, dated May 13, 2019, 8 pages.

*Primary Examiner* — Karl Kurple
(74) *Attorney, Agent, or Firm* — Kinney & Lange, P.A.

(57) ABSTRACT

An embodiment of a line-of-sight coating fixture includes a support structure, a spindle, and a shadow structure. The support structure includes a plurality of compartments disposed below a platter, each compartment having an opening on a periphery of the support structure. Each compartment is adapted to receive and secure a base of a workpiece such that a body of each workpiece to be coated is disposed about a periphery of the support structure and extends above the platter. The spindle is disposed through a center of the platter or support structure for rotating the workpieces thereabout. The shadow structure is disposed about the spindle, inside of the periphery, the shadow structure sized and adapted to shield a portion of each workpiece from line-of-sight coating material.

10 Claims, 5 Drawing Sheets

(51) Int. Cl.
   *B05B 13/02*   (2006.01)
   *B05C 1/00*    (2006.01)
   *B05C 17/00*   (2006.01)
   *B05C 15/00*   (2006.01)
   *H01J 37/32*   (2006.01)

(56) References Cited

U.S. PATENT DOCUMENTS

| | | | |
|---|---|---|---|
| 4,485,759 A * | 12/1984 | Brandolf | B05B 13/0242 |
| | | | 118/503 |
| 4,704,298 A | 11/1987 | Herman et al. | |
| 5,251,409 A | 10/1993 | Orbank | |
| 5,792,267 A * | 8/1998 | Marszal | C23C 4/01 |
| | | | 118/721 |
| 5,813,118 A | 9/1998 | Roedl et al. | |
| 5,997,947 A | 12/1999 | Burns et al. | |
| 6,037,004 A | 3/2000 | Zajchowski et al. | |
| 6,083,322 A | 7/2000 | Burns et al. | |
| 6,162,335 A | 12/2000 | Jordan et al. | |
| 6,224,673 B1 | 5/2001 | Das et al. | |
| 6,419,753 B1 | 7/2002 | Wheat et al. | |
| 6,706,323 B2 | 3/2004 | Wheat et al. | |
| 6,863,927 B2 | 3/2005 | Langley et al. | |
| 7,008,522 B2 | 3/2006 | Boucard et al. | |
| 8,021,719 B2 * | 9/2011 | Graichen | C23C 4/02 |
| | | | 118/301 |
| 8,105,133 B2 | 1/2012 | Jayabalan | |
| 8,211,234 B2 | 7/2012 | Rosenblatt | |
| 8,308,916 B2 | 11/2012 | Sharp et al. | |
| 8,578,745 B2 | 11/2013 | Berndt et al. | |
| 8,601,974 B2 | 12/2013 | Wang | |
| 8,720,369 B2 * | 5/2014 | Rayman | B05D 1/32 |
| | | | 118/301 |
| 9,381,537 B2 | 7/2016 | Mcpherson et al. | |
| 9,475,076 B2 | 10/2016 | Fernholz et al. | |
| 9,511,469 B2 | 12/2016 | Boon Beng et al. | |
| 9,527,097 B2 | 12/2016 | Savage | |
| 9,644,259 B2 | 5/2017 | Hotz et al. | |
| 9,789,513 B2 | 10/2017 | Feuerstein et al. | |
| 9,861,998 B2 | 1/2018 | Linares | |
| 2004/0261914 A1 | 12/2004 | Boucard et al. | |
| 2005/0161439 A1 | 7/2005 | Wustman et al. | |
| 2006/0021579 A1 | 2/2006 | Bernaski et al. | |
| 2011/0052046 A1 | 3/2011 | Melikian | |
| 2011/0052406 A1 * | 3/2011 | Bruce | F04D 29/023 |
| | | | 427/248.1 |
| 2011/0086169 A1 | 4/2011 | Graicheno | |
| 2013/0071575 A1 * | 3/2013 | Muller | C23C 4/134 |
| | | | 414/754 |
| 2013/0149450 A1 | 6/2013 | Feuerstein et al. | |
| 2013/0177707 A1 * | 7/2013 | Feuerstein | C23C 14/56 |
| | | | 118/500 |
| 2013/0189429 A1 | 7/2013 | Walter | |
| 2013/0323058 A1 | 12/2013 | Zhang et al. | |
| 2015/0332900 A1 | 11/2015 | Fowler et al. | |
| 2016/0184959 A1 | 6/2016 | Martin et al. | |
| 2016/0333706 A1 | 11/2016 | Uihlein et al. | |
| 2017/0144184 A1 | 5/2017 | Pfeifle et al. | |
| 2021/0047718 A1 | 2/2021 | Dyson et al. | |

* cited by examiner

LINE-OF-SIGHT COATING FIXTURE AND APPARATUS

CROSS-REFERENCE TO RELATED APPLICATION(S)

This application is a divisional of U.S. application Ser. No. 15/852,558 filed Dec. 22, 2017 for "LINE-OF-SIGHT COATING FIXTURE AND APPARATUS" by E. Jorzik.

BACKGROUND

The disclosure is related generally to fixtures for line-of-sight coating apparatus, and more specifically to fixtures for optimizing throughput of line-of-sight coating apparatus.

Many vapor coating, and other line-of-sight coating fixtures, in particular for airfoils, are limited to hold a single part per fixture. Attempts to increase the number of workpieces on a single fixture often lead to uneven coating application, either due to inadvertent blocking of the coating stream by portions of the fixture, or by uneven heating throughout the chamber, leading to differences in adhesion and microstructure of the coating.

As such, conventional approaches utilize multiple fixtures, each with a single workpiece, fixed to a rake or other device disposed at the base of the chamber in order to somewhat increase efficiency and throughput for a batch coating process. However, each coating machine is limited in how many fixtures it can hold, and the cost of additional machines can be cost-prohibitive when trying to ramp up production from a product introduction to sustained long-term operation.

SUMMARY

An embodiment of a line-of-sight coating fixture includes a support structure, a spindle, and a shadow structure. The support structure includes a plurality of compartments disposed below a platter, each compartment having an opening on a periphery of the support structure. Each compartment is adapted to receive and secure a base of a workpiece such that a body of each workpiece to be coated is disposed about a periphery of the support structure and extends above the platter. The spindle is disposed through a center of the platter or support structure for rotating the workpieces thereabout. The shadow structure is disposed about the spindle, inside of the periphery, the shadow structure sized and adapted to shield a portion of each workpiece from line-of-sight coating material.

A method of line-of-sight coating includes securing a base of a workpiece to a support structure including a plurality of compartments disposed below a platter. Each compartment has an opening on a periphery of the support structure for receiving each workpiece base, such that a body of each workpiece to be coated is disposed about a periphery of the support structure and extends above the platter. The workpieces are rotated about a spindle disposed through a center of the platter or support structure. A portion of each workpiece is shielded from a stream of line-of-sight coating material via a shadow structure disposed about the spindle, inside of the periphery.

DETAILED DESCRIPTION

Figure 1:
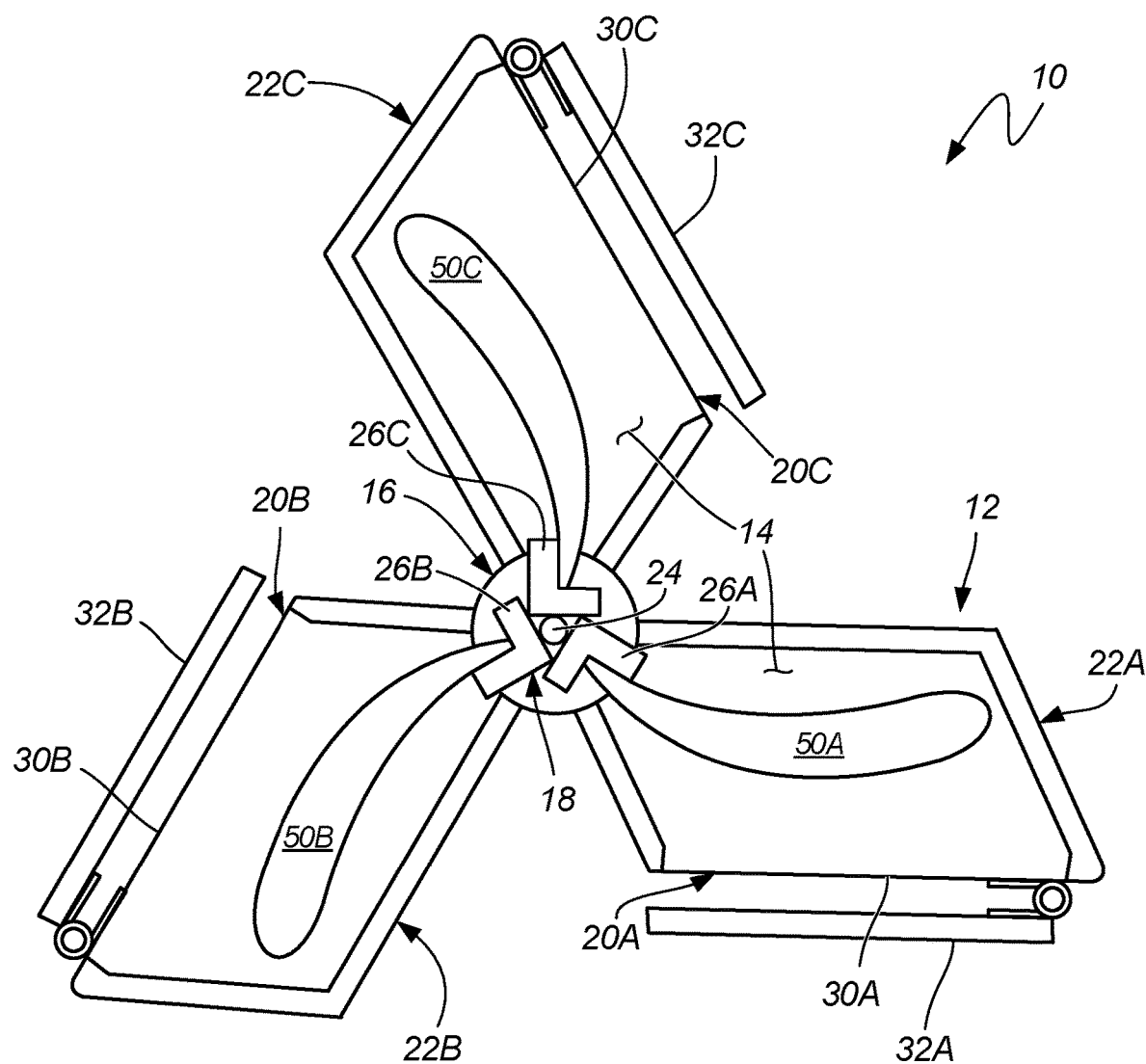
FIG. 1 is a top view of a non-limiting example embodiment of a line-of-sight coating fixture according to the disclosure.
Figure 2:
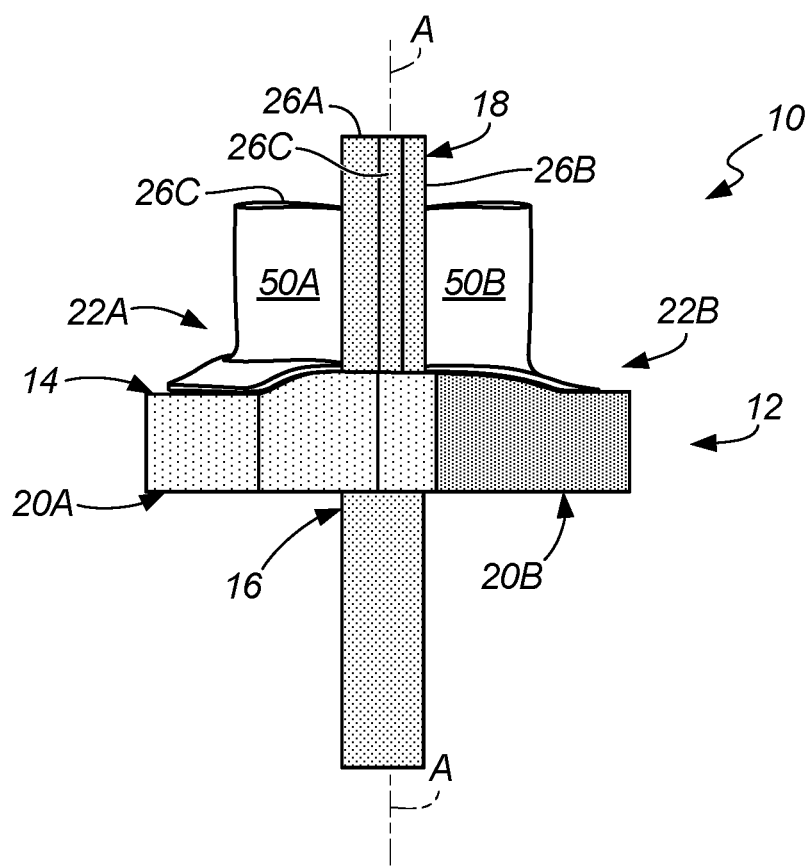
FIG. 2 is a side view of the example coating fixture of FIG. 1 and the example workpiece of FIG. 3.

FIG. 1 is a top view, and FIG. 2 is a side view of a non-limiting example embodiment of a line-of-sight coating fixture 10. Referring first to FIG. 1, fixture 10 includes support structure 12, platter 14, spindle 16, shadow structure 18, compartments 20A, 20B, 20C, and workpieces 50A, 50B, 50C (example workpiece shown in FIG. 3). Support structure 12, in this example, includes three coating positions 22A, 22B, 22C to retain workpieces 50A, 50B, 50C about a periphery. Spindle 16 retains support structure 12 and includes hole 24 disposed through a center of support structure 12 for rotating workpieces 50A, 50B, 50C thereabout.

Also visible in FIG. 1 is shadow structure 18 disposed about spindle 16, inward of the periphery. In this example having three coating positions 22A, 22B, 22C, shadow structure 18 includes three respective shadow bars 26A, 26B, and 26C, each adapted to shield a portion of workpieces 50A, 50B, 50C from a line-of-sight coating or other stream (shown in FIG. 4). Each compartment 20A, 20B, 20C has a respective opening 30A, 30B, 30C on the periphery of support structure 12 below platter 14.

Moving to FIG. 2 (but still partially visible in FIG. 1), compartments 20A, 20B, 20C are each adapted to receive and secure a base of respective workpieces 50A, 50B, 50C such that a body of each workpiece to be coated extends above platter 14 and is disposed about periphery of support structure 12. One or more of compartments 20A, 20B, 20C, can optionally be an enclosure having one or more hinged doors 32A, 32B, 32C to fully shield the base of each workpiece.

Figure 3:
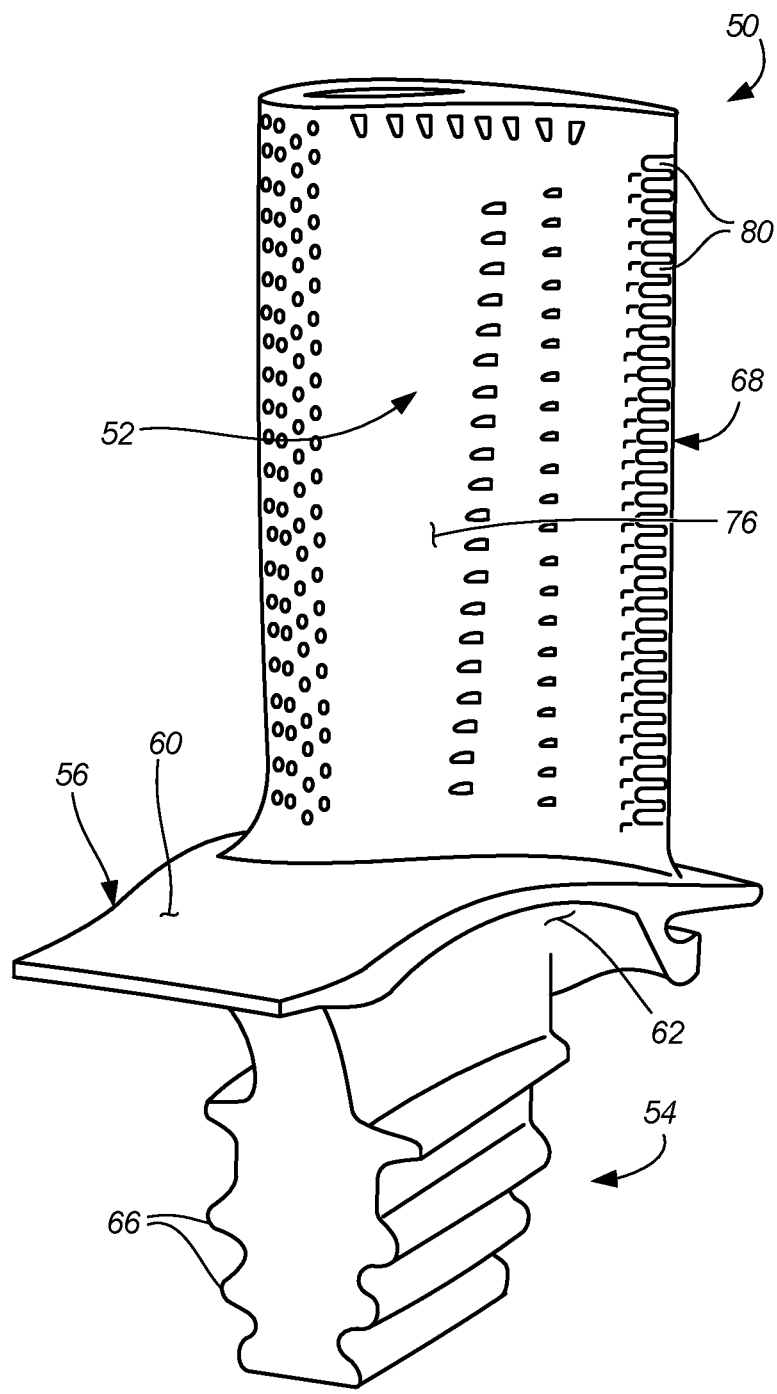
FIG. 3 is a non-limiting example workpiece for which the example coating fixture of FIGS. 1 and 2 is adapted.

As already seen from FIGS. 1 and 2, one or more of workpieces 50A, 50B, 50C can include a plurality of rotor blades, an example of which is seen in FIG. 3. Referring momentarily to FIG. 3, example rotor blade 50 includes, inter alia, airfoil 52, root 54, and platform 56. Other elements of blade 50 will be described with respect to FIGS. 3 and 4 as they relate to the coating apparatus and method.

Returning to FIGS. 1 and 2, for purposes of coating a rotor blade, each compartment 20A, 20B, 20C is adapted to receive and secure root 54 such that airfoil portion 52, to be coated, is disposed about the periphery of support structure 12 and extends above platter 14. In certain embodiments, upper surface 60 of platter 14 can be shaped to conform to platform(s) 56 of each of the rotor blades 50, such that upper surface 60 of platform 56 is exposed in the same manner of airfoil 52, while a lower surface 62 of platform 56 is shielded in the manner of root 52.

For flexibility in coating different types of workpieces on the same equipment, the inside surfaces of one or more of compartments 20A, 20B, 20C can be shaped and adapted to conform to the base or root of each workpiece. In the example blade shown in FIG. 3, root 54 is of a dovetail type with multiple lobes 66 of decreasing dimension. As such, inside surfaces of e.g., compartment 20A can be provided with corresponding lobes (examples shown in FIGS. 5 and 6) to closely receive and securely retain the blade. Alternately, a workpiece may have a single lobe, and as such these surfaces can conform accordingly. This optional adjustment to compartments 20A, 20B, 20C can be done on either a temporary or permanent basis. For purposes of illustration, this disclosure illustrates (in FIGS. 5 and 6) two example pairs of removable inserts adapted to conform to the compartment and to two common types of roots for such workpieces. It will be appreciated that shrouds or other mounting structures can be made.

This arrangement also allows a span of each of the plurality of airfoils 52 to be aligned with a rotational axis A of the fixture/spindle. Further, in this example, the plurality of shadow bars 26A, 26B, 26C include walls defining a recess for receiving parts of the airfoil that are not to be coated. Here, as shown in FIGS. 1 and 2, these recesses separately cover each trailing edge 68 of the plurality of airfoils 52. The recesses defined by the plurality of shadow bars also cover a portion of the pressure surface 76 adjacent to the trailing edge 68. This may be, for example, to cover windows, outlets, and or cooling slots 80 in trailing edge 68 and prevent coating material from infiltrating the interior of airfoil 52.

Figure 4:
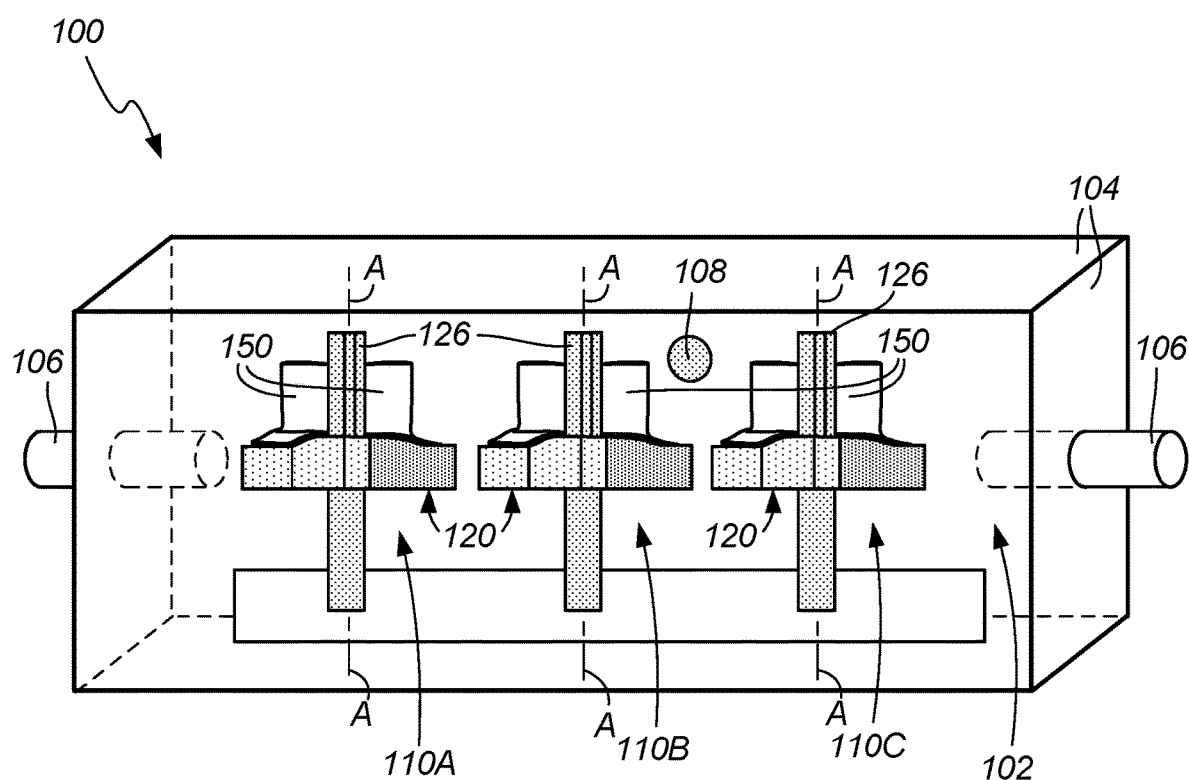
FIG. 4 is an example line-of-sight coating apparatus with multiple instances of the example embodiment disposed therein.

FIG. 4 shows a line-of-sight coating apparatus 100 in which multiple fixtures can be used. Generally, apparatus 100 includes coating chamber 102 defined by chamber walls 104, vacuum/environmental port(s) 106, and at least one line-of-sight coating source 108 disposed along at least one wall 104. Source 108, which can include an EB-PVD coating source, is directed toward a plurality of fixtures 110A, 110B, 110C, at least one of which includes an embodiment of the above described fixture 10.

As shown in FIG. 4, fixtures 110A, 110B, 110C are arranged linearly and/or longitudinally opposed to coating source 108, selectively exposing surfaces of workpieces 150 to be coated. As described with respect to FIGS. 1 and 2, compartments 120 are operative to shield at least the base of each workpiece 150 from the line-of-sight coating material. As above, workpieces 150 can include a plurality of rotor blades, so that compartments 120 each include a wall or walls adapted to receive and secure a root portion of a rotor blade such that a platform portion and an airfoil portion extend above the platform in a first orientation. An upper surface of the blade platform is exposed to the line-of-sight coating source and a lower surface of the platform is shielded from the line-of-sight coating source, and the plurality of shadow bars 126 cover each trailing edge and a portion (e.g., windows, outlets, and/or slots) of the pressure surface adjacent to the trailing edge of the plurality of airfoils.

The arrangement shown in FIG. 4 is but one example of increasing coating throughput using the disclosed subject matter. Since the multi-piece fixtures shown herein are larger than a single-piece fixture known in the art, fewer multi-piece fixtures can fit into a coating chamber of a given size. However, the example shown still results in increased throughput, as three of the example three-piece fixtures can fit into a chamber previously known to hold five single-piece fixtures. This is a throughput increase of about 80%.

This not only increases the total number of parts which are coated per charge in the machine, but also created a more stable temperature gradient due to the added, consistent thermal mass. This even temperature leads to a more consistent coating from part to part, even when located on different fixtures.

Figure 5:
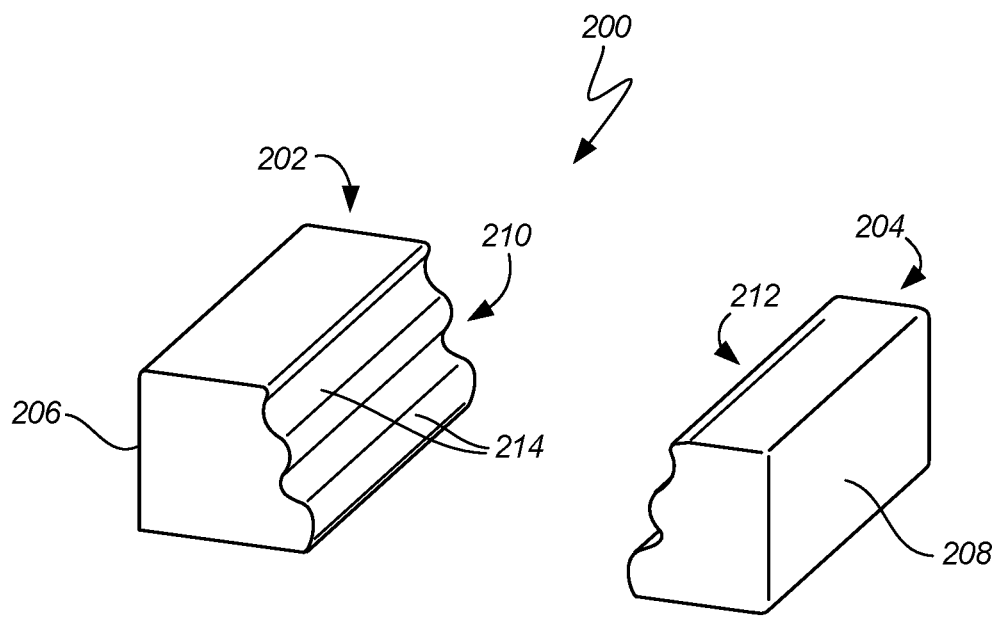
FIG. 5 is an example insert for a dovetail root.

FIG. 5 shows a removable insert 200 for one or more compartments 20, and includes a first insert piece 202 and a second insert piece 204 adapted to conform to first and second sides of a dovetail (multi-lobe) root. Here, outer side walls 206, 208 of respective insert pieces 202, 204 are generally straight, while inner side walls 210, 212 define multiple lobes 214 corresponding to the negative surfaces of root 54 in blade 50. These inserts 202, 204 are inserted into compartment 20 as shown (in FIGS. 1 and 2) so that the blade is held upright for airfoil coating.

Figure 6:
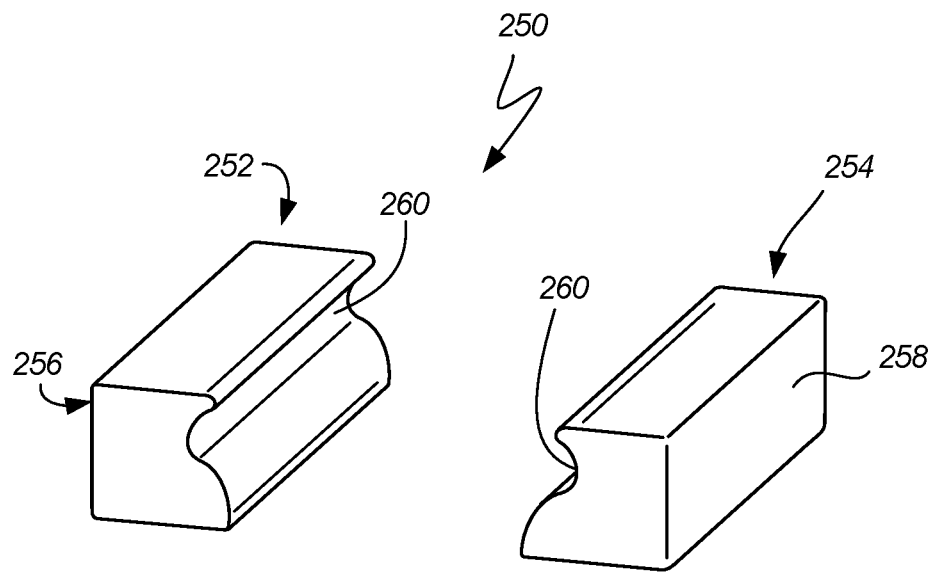
FIG. 6 is an example insert for a single-lobe root.

FIG. 6 shows a removable insert 250 for one or more compartments 20, and includes a first insert piece 252 and a second insert piece 254 adapted to conform to first and second sides of a single-lobe root. As in FIG. 5, outer side walls 256, 258 are generally straight to conform to compartment 20, and inner side walls have a single lobe 260 corresponding to the neck of blade 50 (between airfoil 52 and root lobe 56). As with FIG. 5, these are inserted into compartment 20 as shown so that the blade is held upright for airfoil coating. In either case, however, these example inserts can be adapted for blades having roots arranged transverse to the blade chord, rather than collinear.

Summarizing a method of line-of-sight coating using the apparatus disclosed herein, a base of a workpiece is secured to a support structure including a plurality of compartments disposed below a platter. Each compartment has an opening on a periphery of the support structure for receiving each workpiece base, such that a body of each workpiece to be coated is disposed about a periphery of the support structure and extends above the platter. The workpieces are rotated about a spindle disposed through a center of the platter/support structure. A portion of each workpiece is shielded from one or more streams of line-of-sight coating material via a shadow structure disposed about the spindle.

As previously described, the plurality of workpieces can include one or more rotor blades, and as such, each compartment can be adapted to receive and secure a root of each rotor blade workpiece such that an airfoil portion of each rotor blade workpiece to be coated is disposed about a periphery of the support structure and extends above the platter. The platter can be shaped to conform to a platform of each of the plurality of rotor blades, such that an upper surface of the platform is exposed and a lower surface of the platform is shielded.

Discussion of Possible Embodiments

The following are non-exclusive descriptions of possible embodiments of the present disclosure.

An embodiment of a line-of-sight coating fixture includes a support structure, a spindle, and a shadow structure. The support structure includes a plurality of compartments disposed below a platter, each compartment having an opening on a periphery of the support structure. Each compartment is adapted to receive and secure a base of a workpiece such that a body of each workpiece to be coated is disposed about a periphery of the support structure and extends above the platter. The spindle is disposed through a center of the platter or support structure for rotating the workpieces thereabout. The shadow structure is disposed about the spindle, inside of the periphery, the shadow structure sized and adapted to shield a portion of each workpiece from line-of-sight coating material.

The fixture of the preceding paragraph can optionally include, additionally and/or alternatively, any one or more of the following features, configurations and/or additional components:

A line-of-sight coating fixture, according to an exemplary embodiment of this disclosure, among other possible things includes a support structure including a plurality of compartments disposed below a platter, each compartment having an opening on a periphery of the support structure, and each compartment adapted to receive and secure a base of a workpiece such that a body of each workpiece to be coated is disposed about a periphery of the support structure and extends above the platter; a spindle disposed through a center of the platter or support structure for rotating the workpieces thereabout; and a shadow structure disposed about the spindle, inside of the periphery, the shadow structure sized and adapted to shield a portion of each workpiece from line-of-sight coating material.

A further embodiment of the foregoing fixture, wherein the compartment is defined by an enclosure including at least one hinged door.

A further embodiment of any of the foregoing fixtures, wherein the plurality of workpieces include a plurality of rotor blades.

A further embodiment of any of the foregoing fixtures, wherein each compartment is adapted to receive and secure a root of a workpiece such that an airfoil portion of each workpiece to be coated is disposed about a periphery of the support structure and extends above the platter.

A further embodiment of any of the foregoing fixtures, wherein the platter is shaped to conform to a platform of each of the plurality of rotor blades, such that an upper surface of the platform is exposed and a lower surface of the platform is shielded.

A further embodiment of any of the foregoing fixtures, further comprising at least one removable insert adapted to conform to the root of each workpiece.

A further embodiment of any of the foregoing fixtures, wherein the at least one removable insert includes a first insert and a second insert adapted to conform to first and second sides of a dovetail root.

A further embodiment of any of the foregoing fixtures, wherein a span of the plurality of airfoils are aligned with a rotational axis of the fixture/spindle.

A further embodiment of any of the foregoing fixtures, wherein the shadow structure includes a plurality of shadow bars including a plurality of shadow walls defining a recess for separately covering each trailing edge of the plurality of airfoils.

A further embodiment of any of the foregoing fixtures, wherein the recesses defined by the plurality of shadow bars also cover a window or outlet portion of the pressure surface adjacent to the trailing edge.

A line-of-sight coating apparatus including a coating chamber defined by at least one wall and a line-of-sight coating source disposed along the at least one wall and directed toward a plurality of fixtures according to an embodiment of any of the foregoing fixtures.

A further embodiment of the foregoing apparatus, wherein the plurality of fixtures are arranged linearly or longitudinally opposed to the coating source.

A further embodiment of any of the foregoing apparatus, wherein the compartments are operative to shield at least the base of each workpiece from the line-of-sight coating material.

A further embodiment of any of the foregoing apparatus, wherein the coating source includes an EB-PVD coating source.

A further embodiment of any of the foregoing apparatus, wherein the plurality of workpieces include a plurality of rotor blades, and wherein the plurality of compartments each include at least one removable insert adapted to receive and secure a root portion of a rotor blade such that a platform portion and an airfoil portion extend above the platform in a first orientation.

A further embodiment of any of the foregoing apparatus, wherein the platter is shaped to conform to a platform contour of each of the plurality of rotor blades, such that an upper surface of the platform is exposed to the line-of-sight coating source and a lower surface of the platform is shielded from the line-of-sight coating source.

A further embodiment of any of the foregoing apparatus, wherein the shadow structure includes a plurality of shadow bars including at least one wall defining a recess for separately covering each trailing edge and a window or outlet portion of the pressure surface adjacent to the trailing edge of the plurality of airfoils.

A method of line-of-sight coating includes securing a base of a workpiece to a support structure including a plurality of compartments disposed below a platter. Each compartment has an opening on a periphery of the support structure for receiving each workpiece base, such that a body of each workpiece to be coated is disposed about a periphery of the support structure and extends above the platter. The workpieces are rotated about a spindle disposed through a center of the platter or support structure. A portion of each workpiece is shielded from a stream of line-of-sight coating material via a shadow structure disposed about the spindle, inside of the periphery.

The method of the preceding paragraph can optionally include, additionally and/or alternatively, any one or more of the following features, configurations and/or additional components:

A method according to an exemplary embodiment of this disclosure, among other possible things includes securing a base of a workpiece to a support structure including a plurality of compartments disposed below a platter, each compartment having an opening on a periphery of the support structure for receiving each workpiece base, such that a body of each workpiece to be coated is disposed about a periphery of the support structure and extends above the platter; rotating the workpieces about a spindle disposed through a center of the platter or support structure; and shielding a portion of each workpiece from a stream of line-of-sight coating material via a shadow structure disposed about the spindle, inside of the periphery.

A further embodiment of the foregoing method, wherein the plurality of workpieces include a plurality of rotor blades; and wherein each compartment is adapted to receive and secure a root of each rotor blade workpiece such that an airfoil portion of each rotor blade workpiece to be coated is disposed about a periphery of the support structure and extends above the platter.

A further embodiment of any of the foregoing methods, wherein the platter is shaped to conform to a platform of each of the plurality of rotor blades, such that an upper surface of the platform is exposed and a lower surface of the platform is shielded.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A line-of-sight coating apparatus comprising:
a coating chamber defined by at least one wall;
a plurality of coating fixtures within the coating chamber, each of the plurality of coating fixtures comprising:
- a support structure;
- a platter;
- a plurality of compartments disposed below the platter and partially defined by the platter, each of the plurality of compartments being separately enclosable by a respective hinged door disposed on a periphery of the support structure;
    - wherein each of the plurality of compartments adapted to receive and secure a root of a rotor blade such that the root is disposed below the platter and an airfoil of the rotor blade extends above the platter; and
    - wherein each of the plurality of compartments further comprises a respective removable insert adapted to conform to the root of the rotor blade, the insert being removable from a respective one of the plurality of compartments;
- a spindle disposed through a center of the support structure for rotating a plurality of rotor blades thereabout; and
- a shadow structure disposed about the spindle, above the platter and inside of the periphery, the shadow structure comprising a plurality of individual shadow bars disposed with rotational symmetry about the spindle; and
a line-of-sight coating source disposed along the at least one wall and directed toward the plurality of coating fixtures.

2. The apparatus of claim 1, wherein plurality of coating fixtures are arranged linearly or longitudinally opposed to the coating source.

3. The apparatus of claim 1, wherein the coating source includes an electron beam physical vapor deposition (EB-PVD) coating source.

4. The apparatus of claim 1, wherein each platter is shaped to conform to a platform of each of the plurality of rotor blades, such that an upper surface of the platform is exposed to the line-of-sight coating source and a lower surface of the platform is shielded from the line-of-sight coating source.

5. The apparatus of claim 1, wherein each of the plurality of shadow bars comprises abutting walls defining a recess for separately covering a trailing edge of each airfoil and shielding the trailing edge of each airfoil from coating material from the line-of-sight coating source.

6. The apparatus of claim 5, wherein the recess defined by the abutting walls of each of the plurality of shadow bars also covers a portion of a pressure surface of the airfoil adjacent to the trailing edge.

7. The apparatus of claim 1, wherein the removable insert includes a first insert piece and a second insert piece, each of the first and second insert pieces having an inner side wall with at least one lobe.

8. The apparatus of claim 1, wherein a span of each airfoil is aligned with a rotational axis of the spindle.

9. The apparatus of claim 5, wherein for each of the plurality of compartments, the root of the rotor blade is oriented such that the trailing edge is the radially innermost portion of the airfoil with respect to the spindle.

10. The apparatus of claim 1, wherein all of the plurality of compartments are distributed with rotational symmetry about the spindle.

* * * * *